United States Patent [19]

Gershenfeld et al.

[11] Patent Number: 5,917,322

[45] Date of Patent: Jun. 29, 1999

[54] METHOD AND APPARATUS FOR QUANTUM INFORMATION PROCESSING

[75] Inventors: Neil Gershenfeld, Somerville, Mass.; Isaac Chuang, Prospect, Ky.

[73] Assignee: Massachusetts Institute of Technology, Cambridge, Mass.

[21] Appl. No.: 08/728,272

[22] Filed: Oct. 8, 1996

[51] Int. Cl.[6] ............................. G01R 33/44; G01R 33/46
[52] U.S. Cl. ............................................. 324/307; 324/312
[58] Field of Search ..................................... 324/300, 307, 324/308, 309, 310, 311, 312, 313, 314, 315

[56] References Cited

PUBLICATIONS

Lloyd, "A Potentially Realizable Quantum computer", *Science*, vol. 261, Sep. 1993, pp. 1569–1571.
Lloyd, "Almost Any Quantum Logic Gate is Universal," *Physical Review Letters*, vol. 75, No. 2, Jul. 1995, pp. 346–349.
Turchette et al., "Measurement of Conditional Phase Shifts for Quantuim Logic," *Physical Review Letters*, vol. 75, No. 25, Dec. 1995, pp. 4710–4713.
Monroe et al., "Demonstration of a Fundamental Quantum Logic Gate," *Physical Review Letters*, vol. 75, No. 25, Dec. 1995, pp. 4714–4717.
Gershenfeld et al., "Bulk Spin–resonance Quantum Computation," *Science*, vol. 275, Jan. 1997, pp. 350–356.
Cory et al., "Ensemble Quantum Computing by NMR Spectroscopy," *Proc. Natl. Acad. Sci. USA*, vol. 94, Mar. 1997, pp. 1634–1639.
Bowden et al., "Quantum Computing Using Electron––nuclear Double Resonances," *SPIE*, vol. 3076, Apr. 1997, pp. 173–182.
P. Shor, in *Proc. 35th Ann. Symp. on Found. of Comp. Sci.* at 124 (1994).
Cirac et al., *Phys. Rev. Lett.* 74:4091 (1995).
Bandyopadhyay et al., *Jpn. J. Appl. Phys.* 35:3350 (1996).
Chuang et al., *Phys. Rev. A* 52:3489 (1995).
DiVencenzo, *Phys. Rev. A* 51:1015 (1995).

*Primary Examiner*—Edward P. Westin
*Assistant Examiner*—John R. Lee
*Attorney, Agent, or Firm*—Cesari and McKenna, LLP

[57] ABSTRACT

An approach to processing quantum information uses a bulk ensemble of a very large number of identical entities as its source of quantum degrees of freedom. The information is represented as the deviation from uniform population probability for at least one of the quantum states of the ensemble. Coherences between quantum states, created when the ensemble is modified in a way that removes it from thermal equilibrium can serve as effective degrees of freedom. A bulk thermal ensemble of nuclear spins in a static magnetic field is treated using nuclear magnetic resonance pulses for preparation of an initial pure state, and effecting arbitrary single-spin and coupled multi-spin rotations. Readout of the result is accomplished by observation of the magnetization of the ensemble.

71 Claims, 2 Drawing Sheets

METHOD AND APPARATUS FOR QUANTUM INFORMATION PROCESSING

FIELD OF THE INVENTION

The present invention relates generally to quantum (as opposed to classical) information processing, and in particular to methods and apparatus facilitating such processing.

BACKGROUND OF THE INVENTION

The concept of using quantum systems to represent and process information has received increasing attention as researchers begin to recognize the theoretical capabilities of such systems. A quantum computer would be able to solve certain problems, such as the factoring of large numbers, much more rapidly than a classical computer. For example, a quantum computing algorithm has been proposed for finding prime factors in polynomial time instead of exponential time, as required by classical approaches. See P. Shor, in *Proc. 35th Ann. Symp. on Found. of Comp. Sci.* at 124 (1994). Also, according to Grover's algorithm, the time required for retrieval of a record from an unsorted database of r records by a quantum computer scales as $\sqrt{r}$ rather than as r, required in deterministic classical computation.

These possibilities have energized the search for practical ways to construct quantum information processors. The difficulties, which are substantial, arise from the nature of quantum systems. A conventional digital computer operates on bits representing classical Boolean states—binary zeroes and ones—and after each computational step, the computer has a definite, exactly measurable state. The state of a quantum computer, by contrast, is described by a wave function or a state in a potentially infinitely large Hilbert space that is indeterminate in the classical sense; it is this indeterminacy that gives rise to the capabilities that characterize quantum computing, but also to the difficulty of realizing practical systems.

In particular, quantum systems exhibit the properties of superposition and entanglement, which are manifested in non-classical correlations. The property of superposition allows a quantum computer to exist in an arbitrary complex linear combination of classical Boolean states, which evolve in parallel according to a unitary transformation. Entanglement prevents some definite states of a complete quantum system from corresponding to definite states of its parts. Thus, the quantum analog to a classical computer would replace two-state Boolean bits with "qubits," which represent two-state quantum systems. A qubit can represent the two classical binary states (e.g., by a fixed pair of orthogonal quantum states), but also entangled states in which neither qubit by itself has a definite state. As a result, while the state (i.e., contents) of an k-bit register in a classical computer is completely specified by k Boolean values, a k-qubit register requires $2^k$ values; as the number of qubits increases, therefore, exponentially more values are required to specify their state.

Unfortunately, the quantum states and their correspondences that are necessary for computation are not easily manipulated and maintained under normal environmental conditions. For example, quantum states easily "decohere" (that is, become randomized as a result of entanglement with the environment). Yet a quantum computer must not only exhibit the nonlinear interactions and persistence of states necessary for computation and its readout, but also facilitate control or manipulation of those interactions by external influence-all without strong coupling to the environment.

Because of the apparent tension between these requirements, quantum computation efforts to date have emphasized isolating a small number of individual quantum degrees of freedom in microscopic systems based on trapped ions (Cirac et al., *Phys. Rev. Lett.* 74:4091 [1995]; Monroe et al., *Phys. Rev. Lett.* 75:4714 [1995]), quantum dots (Bandyopadhyay et al., *Jap. J. Appl. Phys.* 35:3350 [1996]), and cavity quantum electrodynamics (Domokos et al., *Phys. Rev. Lett.* 52:3554 [1995]; Turchette et al., *Phys. Rev. Lett.* 75:4710 [1995]; Chuang et al., *Phys. Rev. A* 52:3489 [1995]). In addition to their various theoretical drawbacks—for example, scale-up to larger systems—such systems require enormous technical sophistication and expense for operation and maintenance.

An alternative approach, suggested but never successfully implemented, involves the use of nuclear magnetic resonance (NMR) to modify the spin states of a microscopic system of spins, relying on nonlinear interactions among the spins for computational operations; see, e.g., DiVencenzo, *Phys. Rev. B* 50:1015 (1995). The approach is attractive because in general spin-lattice relaxation times for spin states can be very long, up to thousands of seconds, because the nuclei are very well screened from the environment. Moreover, known multiple-pulse resonance techniques (of the kind routinely used to determine molecular structure) probe complex networks of spin interactions, providing just the sorts of manipulations necessary to achieve computation. Unfortunately, the basic requirements for quantum computation by this approach—preparation of a system with a desired initial condition, the ability to address individual spins to implement a given algorithm, and the capacity for readout of results—pose the same difficulties in an NMR environment as in other environments, since microscopic NMR systems of this type are highly thermalized. It is difficult, for example, to address the quantum states of individual molecules in such a system. At the same time, attempts to modify the system itself (e.g., by adding special spins for input and output) are difficult to accomplish with the precision necessary for reliable computation.

SUMMARY OF THE INVENTION

The invention is a quantum computer having as its source of quantum degrees of freedom a bulk ensemble of a very large number of identical entities. The degrees of freedom correspond to quantum states of the entities. In a bulk sense, the ensemble itself is characterized by population probabilities of these states over the ensemble. The state of the ensemble may therefore be represented, for each quantum state, by a uniform population probability and a deviation therefrom (the magnitude of the deviation being determined, at thermal equilibrium, by a Boltzmann distribution).

In the preferred embodiment, the quantum states of interest are spin states, the ensemble consisting of multi-spin entities having n spins. Thus, a solid body or an aggregate of atoms in the gas phase or molecules forming a liquid could furnish the bulk thermal ensemble of multi-spin entities. Under the influence of a time-invariant magnetic field, each of the spins may be in any of a number of spin states, according to its respective spin quantum number I, contributing to the quantum state of the entity comprising it and of the ensemble. Rather than addressing the enormous number of spins or of n-spin entities individually for processing their associated degrees of freedom, the invention macroscopically manipulates the ensemble, thereby effectively operating on a system corresponding to a single one of the n-spin entities. Thus the massive number of ensemble degrees of freedom are collected into a much smaller set, equal to or less than n, of degrees of freedom (or qubits) used directly for computation. Each qubit corresponds to a specific spin of one of the entities, with the state of a qubit related to population probabilities, over the entire ensemble, of the states available to the corresponding spin.

The presence of the ensemble provides a strong output signal and makes the computer of the invention a massively parallel quantum computer with on the order of $10^{23}$ nearly identical copies of the same basic (generally molecular) entity. This redundancy allows repeated measurements to estimate its quantum state with high fidelity and convenience, since it is the ensemble, and not any particular entity therein, that is addressed. The continuous interaction of the ensemble with its surroundings, either imposed intentionally for purposes of observing the quantum state of the ensemble or due to inherent properties of the attendant apparatus, leads to a loss of coherence in the small number of useful degrees of freedom. However, the coupling between the ensemble and its surroundings is sufficiently weak for typical bulk ensembles of spins that the spin-lattice relaxation time may be on the order of thousands of seconds. Most of the Hilbert space of the bulk ensemble contributes to the computation only by providing the redundancy that protects the very small subspace that is directly used for quantum computation.

Although only this small subset of the ensemble degrees of freedom are used as qubits in quantum computation, coherences between quantum states of the system, created when the quantum state of the ensemble is modified so that it is no longer in thermal equilibrium, are indispensable to operation of the invention as effective quantum degrees of freedom. Approximately $2^{2n}$ coherence effective degrees of freedom, represented by nonzero off-diagonal terms in the deviation component of the density matrix of population probabilities, are available. The use of coherence effective degrees of freedom enables preparation of the initial state, implementing the computation algorithm, and reading out the result, as discussed below.

Applying an electromagnetic pulse to the ensemble, as is done in nuclear magnetic resonance techniques for studying the structure of a system of nuclear spins, changes the populations of the quantum states and creates coherences between them, modifying the ensemble away from thermal equilibrium. In subsequent evolution of the spins in the absence of the pulse, the population probabilities of the quantum states remain constant, within the spin-lattice relaxation time, while the coherences decay. The persistence of the modification from equilibrium introduced by the electromagnetic pulse makes direct exploitation of the n degrees of freedom—as n or fewer qubits—possible.

The approach of the invention can be used to perform the four tasks known to be necessary for quantum computing: loading an arbitrary initial state; performing arbitrary single-spin rotations; applying a nonlinear multi-spin function; and reading out the results.

In one aspect, the invention provides a novel technique for preparation of the initial state of the ensemble required as an input for quantum computation. According to the technique, the ensemble is treated in a manner that gathers together existing classical correlations among spins to create effectively pure states. In one such approach, one subset of the spins, the "qubit spins", is prepared in a pure state when conditioned on the spin states of the remaining spins, called the "ancilla spins", by transferring entropy from the conditionally pure qubit-spin state to other states; the ancilla spins do not participate in subsequent computation operations. In particular, for a four-spin system, the invention provides a unitary transform for creating 4 independent two-spin conditionally pure states.

Any arbitrary single-spin rotation may be imposed on the system by treating the ensemble using standard NMR pulse techniques including refocusing and decoupling to selectively suppress the effects of coupling between spins. A nonlinear multi-spin function may be imposed by applying one or more pulses executing rotation corresponding to spin-interaction Hamiltonian terms. In particular, the invention provides a pulse sequence that implements the controlled-NOT gate for a two-spin system.

Readout of the result of the computation is accomplished by determination of the modification of the deviation and coherences from measurement of a magnetization of the ensemble—for example the bulk magnetization as is conventional in NMR practice—with application of additional NMR pulses as needed to render observable the population probabilities and coherences of interest.

Although almost any bulk material is a candidate for the bulk thermal ensemble, of special interest are molecular liquids with a plurality of distinguishable nuclei, since a subset of these nuclei give rise to the qubits used for computation. Heteronuclear ring structures furnish readily available examples. For instance, 2,3-dibromothiophene provides a two-spin, one- or two-qubit system, while 2,3-dibromopropionic acid or a symmetrically trisubstituted benzene with different substituents provides a three-spin system with up to three qubits. Larger molecules with additional distinguishable spins are straightforwardly identified and provide further quantum degrees of freedom and therefore more qubits for computation (although, because computation is ordinarily carried out on a pure state—a jointly pure state in a multi-spin system—the complexity of actual use may increase sharply with the number of qubit spins).

Accordingly, in a preferred embodiment, the invention provides a method of quantum computation requiring only readily available bulk materials and conventional NMR equipment.

DESCRIPTION OF THE DRAWING

The foregoing discussion will be understood more readily from the following detailed description of the invention, when taken in conjunction with the accompanying drawings, in which.

DETAILED DESCRIPTION OF THE INVENTION

Nuclear Magnetic Resonance Techniques

In a time-invariant applied magnetic field $\hat{B}=B_o\hat{(z)}$, a nucleus of spin I has 2I+1 possible quantum spin states at equally spaced corresponding energy levels, any pair of levels being separated by $$\Delta E = \frac{\mu B_o}{I}$$

corresponding to the resonant frequency $$\omega = \frac{\Delta E}{\hbar}.$$

The magnetic moment of the nucleus $$\mu = \frac{\gamma h I}{2\pi}$$

includes the gyromagnetic moment γ, which is a constant for a given nucleus. A nucleus of spin I=½ may thus be in either of two spin states, designated up $|\uparrow>$ (i.e., having its magnetic moment component aligned with the applied magnetic field), and down $|\downarrow>$ (i.e., having its moment component antiparallel to the field). The two spin states may also be represented as 1 and 0, respectively, so that the spin state of such an I=½ nucleus may represent the value of a binary digit.

For an ensemble of a very large number of such identical spins, the spin state assumed by each spin at thermal equilibrium is such that the possible spin states of the ensemble are populated by individual entities according to a Boltzmann distribution. The differential population of the up and down spin states due to the Boltzmann distribution gives rise to a time-invariant net ensemble magnetization along the static field. The precession of the spins at $\omega=\gamma\beta_o$ about the direction of the static field has no phase coherence with respect to the x or y axes, so the net magnetization has no x or y component.

A two-spin entity, for example a binuclear molecule A-B, with both spins having I=½, has four possible quantum states according to the possible spin states of the component spins, namely $|\uparrow\uparrow>, |\uparrow\downarrow>, |\downarrow\uparrow>$, and $|\downarrow\downarrow>$. For an ensemble of a very large number of such two-spin entities, at thermal equilibrium the possible quantum states will be populated by individual entities according to a Boltzmann distribution. The differential population of quantum spin states according to the Boltzmann distribution gives rise to a net ensemble magnetization along the z direction.

An RF electromagnetic field of frequency ω and phase φ applied along the x direction to the ensemble in the static magnetic field introduces a magnetic field of magnitude $B_1$ that can be viewed as a single field rotating about the z axis at ω. In a frame of reference rotating with this magnetic field, the spin experiences an effective magnetic field having the components $(B_1 \cos\phi)\hat{x}$, $(B_1 \sin\phi)\hat{y}$, and $$\left(B_o - \frac{\omega}{\gamma}\right)\hat{z}.$$

For pairs of quantum states separated by ΔE corresponding to frequencies near but not equal to ω, even a moderately large value of $B_1$ can dominate the small deviation of those resonant frequencies from $B_o\gamma$, so it is a good approximation to ignore the $B_o$ term and view all of such spins as precessing about the effective field $B_1$.

If the electromagnetic radiation were applied for a finite period of time, such as in a pulse of duration $t_p$, the nuclear magnetic moments would precess about $B_1$ through an angle $\theta=\gamma B_1 t_p$. Thus, by proper adjustment of $B_1$ and $t_p$, θ may be tailored to effect a rotation of the spins through an arbitrary angle about the x axis.

In general, such a pulse modifies the ensemble so that it is no longer in thermal equilibrium, redistributing the population of quantum states and creating coherences between them. Following such a pulse, the spins resume precessing about the static field with a phase relationship that persists until spin-lattice relaxation randomizes it. Conventional NMR techniques include observation of the ensemble magnetization after one or more such pulses to elucidate the types of spins present and their interactions.

Composing a sequence of pulses to perform an arbitrary rotation of an uncoupled spin around any axis is a straightforward matter. However spin interactions complicate implementation of a single-spin rotation of a spin coupled to another. For example, after a pulse, the evolution of spins of a diatomic molecule having a weak spin-spin interaction compared to the Zeeman energy is governed in the rotating frame by a Hamiltonian that can be expressed as $H = \hbar\omega_A \hat{I}_{zA} + \hbar\omega_B \hat{I}_{zB} + \hbar\omega_{AB} \hat{I}_{zA} \hat{I}_{zB}$. The time evolution operator $$\exp\left(\frac{iHt}{\hbar}\right)$$

can be expressed as the product of three operators $\hat{R}_{zA}(\omega_A t)$, $\hat{R}_{zB}(\omega_B t)$, and $\hat{R}_{zAB}(\omega_{AB} t)$, all of which commute with one another, describing rotations about the z axis. $\hat{R}_{zA}(\omega_A t)$ and $\hat{R}_{zB}(\omega_B t)$ describe rotation of the A and B spin degrees of freedom. $\hat{R}_{zAB}(\omega_{AB} t)$ is a coupled two-spin rotation. In terms of product operator formalism, $\hat{R}_{zAB}(\omega_{AB} t)$ acts only on product operator terms consisting of an x or y and a 1 or z and is a rotation in the x-y plane at $\omega_{AB} t$, exchanging 1 or z and vice-versa.

However, arbitrary rotation of one of a coupled set of spins A-B is possible using a technique well known in the nuclear magnetic resonance art as refocusing. In the case that $\omega_A$ and $\omega_B$ are sufficiently different that each spin of the coupled system can be addressed separately, outside of broadening due to inhomogeneity in $\hat{B}$, by appropriate choice of the frequency of the RF field, then a 180° pulse at $\omega_A$ about any axis φ may be used to reverse the evolution of Hamiltonian terms including $\hat{I}_{zA}$. Namely, $\hat{R}_{\phi A}(180)\hat{R}_{zA}(-\omega_A t)\hat{R}_{\phi A}(180)$ and $\hat{R}_{\phi A}(180)\hat{R}_{zAB}(\omega_{AB}t)=\hat{R}_{zAB}(-\omega_{AB}t)\hat{R}_{\phi A}(180)$. If refocusing pulses are applied to both spins, only the nonlinear two-spin rotation term $\hat{R}_{zAB}(2\omega_{AB}t)$ remains active, since two successive refocusings have no net effect. Such refocusing is useful for allowing evolution only under selected terms of the Hamiltonian and also for removing reversible broadening effects such as spin interactions and magnetic field inhomogeneity. Repeated fast refocusing, known as decoupling, is also useful because it completely stops the dynamics of the affected terms.

Thus, one way to apply a z rotation to only spin A in the coupled A-B system is by applying a refocusing pulse between free evolutions of length $t_1$, i.e., using the sequence $t_1$, $\hat{R}_{xB}(180)$, $t_1$. This refocusing procedure reverses the evolution under the Hamiltonian terms containing $\hat{I}_{zB}$, i.e., the $\omega_B$-term and the $\omega_{AB}$-term, so that only the $\hat{I}_{zA}$ term evolves with the net effect being $\hat{R}_{zA}(2\omega_A t_1)$.

If the spins of the coupled pair cannot be addressed individually by choice of RF frequency, a longer sequence can implement an arbitrary rotation. The first step in $\hat{R}_{\phi A}(90)$, a 90° rotation of the spin A around a direction φ, is $R_{yA,B}(-90)$, a rotation of both spins around ŷ. After refocusing the uncoupled terms by the sequence $$\frac{t_1}{2}, \hat{R}_{xA,B}(180), \frac{t_1}{2}, \hat{R}_{xA,B}(540),$$

followed by evolution for time $t_2$, the rotation $\hat{R}_{(\phi+90)A,B}(90)$ completes the procedure. (The rotation that reverses the flip at the end of the refocusing is taken to be 540° because there is a Berry's phase that gives a minus sign—usually irrelevant—for a total rotation of 360° instead of 720°.) if $\omega_A t_2 = \omega_B t_2 + \pi/2$, $\omega_{AB} t_1 + \omega_A t_2 = 2\pi$ and $\phi = \omega_B t_2$, then the coupled term rotates by $2\pi$ and the uncoupled terms are separated by $\pi/2$, so the result is a 90° rotation of spin A only around a direction $\phi$. It is possible to perform $\hat{R}zA,B(90)$ on the coupled term alone in a similar manner.

The generalization to generate any single-spin rotation in more complex networks of spins is straightforward. Using combinations of transverse rotation pulses with refocusing of the longitudinal rotations introduced by the form of the Hamiltonian is well known to those skilled in the practice of nuclear magnetic resonance techniques.

Probability Density Matrix Formalism

The state of an ensemble comprising a single 1-spin entity may be described by a 2×2 probability density matrix $$\hat{\rho} = \begin{bmatrix} p_\downarrow & 0 \\ 0 & p_\uparrow \end{bmatrix},$$

of which the diagonal terms, or eigenvalues, $p\downarrow$ and $p\uparrow$ represent the probabilities that the spin is in the down and up state, respectively, and the off-diagonal terms, equal to zero at thermal equilibrium, represent coherences between the quantum states. The probability density matrix can be expressed as the sum of two matrices $$\hat{\rho} = \frac{\hat{1}}{2^n} + \hat{\rho}_\Delta;$$

the identity matrix $\hat{1}$ representing a uniform background distribution over both of the possible quantum states $|\downarrow>$ and $|\uparrow>$ and the deviation matrix $\hat{\rho}_\Delta$ representing the deviations from identity due to the population of the energetically distinct states according to the Boltzmann distribution. For the spin in the magnetic field, at thermal equilibrium the deviation matrix is $$\hat{\rho}_\Delta = \frac{1}{4}\begin{bmatrix} -\alpha & 0 \\ 0 & \alpha \end{bmatrix},$$

in which $$\alpha = \frac{\hbar \omega}{kT}.$$

For an n-spin entity, assuming weak coupling between the spins, the $2^n \times 2^n$ equilibrium density matrix is the tensor product of the matrices for the individual spins. For example, the density matrix for a two-spin entity, e.g. a diatomic molecule A-B, with $\omega_{AB} << \omega_A$, is $$\hat{\rho} = \begin{bmatrix} p_{\downarrow\downarrow} & 0 & 0 & 0 \\ 0 & p_{\downarrow\uparrow} & 0 & 0 \\ 0 & 0 & p_{\uparrow\downarrow} & 0 \\ 0 & 0 & 0 & p_{\uparrow\uparrow} \end{bmatrix},$$

wherein the diagonal terms show the probability that A and B are in the respective states indicated by the subscripts. At thermal equilibrium the component matrices are $$\hat{\rho} = \frac{1}{4}\begin{bmatrix} 1 & 0 & 0 & 0 \\ 0 & 1 & 0 & 0 \\ 0 & 0 & 1 & 0 \\ 0 & 0 & 0 & 1 \end{bmatrix} + \qquad \text{equation 1}$$

$$\frac{1}{8}\begin{bmatrix} -\alpha_1 - \alpha_2 & 0 & 0 & 0 \\ 0 & -\alpha_1 + \alpha_2 & 0 & 0 \\ 0 & 0 & \alpha_1 - \alpha_2 & 0 \\ 0 & 0 & 0 & \alpha_1 + \alpha_2 \end{bmatrix}$$

wherein $\alpha_1$ and $\alpha_2$ correspond to the respective resonant frequencies of the two spins.

In a liquid sample, the rapid tumbling of individual molecules averages out the interaction between the molecules, so it is a very good approximation to regard the liquid as an ensemble of noninteracting molecules. For such an ensemble of N noninteracting entities, the $2^n N \times 2^n N$ ensemble density matrix decomposes into a tensor product of the N individual density matrices for the entities. Since these matrices are all identical at thermal equilibrium and do not interact during their further evolution, it is sufficient to consider the evolution of a single-entity density matrix to represent the entire ensemble.

A unitary transformation $\hat{U}$, i.e. a transformation described by a matrix whose columns are orthonormal, changes a single-entity density matrix according to $$\hat{U}\hat{\rho}\hat{U}^\dagger = \hat{U}\left[\frac{\hat{1}}{2^N} + \hat{\rho}_\Delta\right]\hat{U}^\dagger = \frac{\hat{1}}{2^N} + \hat{U}\hat{\rho}_\Delta\hat{U}^\dagger. \qquad \text{equation 2}$$

The identity component survives the transform unchanged. Therefore, the dynamics of the quantum states of an ensemble represented by a density matrix can be approximately described by using only the deviation component of the density matrix.

Hereinafter, the evolution of the entire N-entity ensemble is described in terms of only the deviation component $\hat{\rho}_\Delta$ of the density matrix of a single one of the N entities. Although $\hat{\rho}_\Delta$ may appear to be a classical quantity, it truly describes the dynamics of a small quantum system. When thermal equilibrium has been disturbed, such as by the application of an RF pulse, the off-diagonal elements may be large compared to the diagonal elements. These nonzero off-diagonal elements are signatures of quantum coherence within each n-spin entity.

At any given time, the density matrix contains complete information about the status of the ensemble of spins. Population probabilities of quantum states and macroscopic magnetizations can be derived from its elements.

Initial State Preparation

In order to exploit the bulk thermal ensemble to perform quantum computation, the ensemble must be put into an arbitrary initial state. In terms of the deviation matrix formalism, this operation is equivalent to causing the deviation entries to assume certain values. The usual initial state of an ensemble of spins is a statistical mixture of pure states rather than any single pure state. If computation is performed starting with such an initial state, interference between the component pure states would restrict the states that can be reached by the applied operations to fewer than all the states that could be represented by the system. For this reason, the initial state is preferably a pure state. For example, consider a two-spin system A-B for which the difference between the resonant frequencies $\omega_A$ and $\omega_B$ of the two spins is small compared to their average $\omega$. In this case, the deviation matrix at thermal equilibrium (equation 1) is well approximated by $$\hat{\rho}_\Delta \approx \frac{-\alpha}{4}\begin{bmatrix} 1 & 0 & 0 & 0 \\ 0 & 0 & 0 & 0 \\ 0 & 0 & 0 & 0 \\ 0 & 0 & 0 & -1 \end{bmatrix},$$

in which $$\alpha = \frac{\hbar\omega}{kT}.$$

This matrix describes a classically correlated state in which the spins are either both down or both up, i.e., the system is in one of the pure states $|\downarrow\downarrow>$ or $|\uparrow\uparrow>$. Because of conservation constraints it is not possible to put the two-spin system definitely into one or the other of the pure states, corresponding to eliminating one of the nonzero diagonal terms of the deviation matrix, by a procedure describable as a unitary transform applied to the density matrix (as may be implemented by applying RF pulses to an ensemble in a static uniform magnetic field).

However, the second spin may be viewed as a label indicating which one of the two pure states $|\downarrow>$ or $|\uparrow>$ the first spin is in. The structure of $\hat{\rho}_\Delta$ may be viewed as comprising two block-diagonal 2×2 submatrices, each representing the first spin in one of its two pure states conditioned on the state of the second spin.

between the resonant frequencies are small compared to the average resonant frequency, the deviation matrix at thermal equilibrium will usually have only approximately $$\frac{2^{n+1}}{\sqrt{2\pi n}}$$

eigenvalues equal to zero, located at elements representing quantum states having equal numbers of spins in down and up states, and several nonzero diagonal elements. Although a unitary transform cannot change the range of eigenvalues, it can permute the elements of the $2^n \times 2^n$ deviation matrix to arrange its elements in a block structure of $2^k \times 2^k$ matrices, at least one of which corresponds to the desired k-qubit pure state, having $2^k - 1$ eigenvalues equal to zero and thus only one nonzero diagonal element. Analogous to the second spin in the two-spin example above, the n-k spins in excess of the k qubit spins serve only in the preparation of the initial pure state of the qubit spins—not in subsequent computation operations—and are therefore referred to as ancilla spins.

For example, two qubit spins may be prepared in a pure state the state of two ancilla spins. At thermal equilibrium the 16×16 deviation matrix of the 4-spin system ABCD is $$\hat{\rho}_\Delta = \begin{bmatrix}
d_{\downarrow\downarrow\downarrow\downarrow} & 0 & 0 & 0 & 0 & 0 & 0 & 0 & 0 & 0 & 0 & 0 & 0 & 0 & 0 & 0 \\
0 & d_{\downarrow\downarrow\downarrow\uparrow} & 0 & 0 & 0 & 0 & 0 & 0 & 0 & 0 & 0 & 0 & 0 & 0 & 0 & 0 \\
0 & 0 & d_{\downarrow\downarrow\uparrow\downarrow} & 0 & 0 & 0 & 0 & 0 & 0 & 0 & 0 & 0 & 0 & 0 & 0 & 0 \\
0 & 0 & 0 & d_{\downarrow\downarrow\uparrow\uparrow} & 0 & 0 & 0 & 0 & 0 & 0 & 0 & 0 & 0 & 0 & 0 & 0 \\
0 & 0 & 0 & 0 & d_{\downarrow\uparrow\downarrow\downarrow} & 0 & 0 & 0 & 0 & 0 & 0 & 0 & 0 & 0 & 0 & 0 \\
0 & 0 & 0 & 0 & 0 & d_{\downarrow\uparrow\downarrow\uparrow} & 0 & 0 & 0 & 0 & 0 & 0 & 0 & 0 & 0 & 0 \\
0 & 0 & 0 & 0 & 0 & 0 & d_{\downarrow\uparrow\uparrow\downarrow} & 0 & 0 & 0 & 0 & 0 & 0 & 0 & 0 & 0 \\
0 & 0 & 0 & 0 & 0 & 0 & 0 & d_{\downarrow\uparrow\uparrow\uparrow} & 0 & 0 & 0 & 0 & 0 & 0 & 0 & 0 \\
0 & 0 & 0 & 0 & 0 & 0 & 0 & 0 & d_{\uparrow\downarrow\downarrow\downarrow} & 0 & 0 & 0 & 0 & 0 & 0 & 0 \\
0 & 0 & 0 & 0 & 0 & 0 & 0 & 0 & 0 & d_{\uparrow\downarrow\downarrow\uparrow} & 0 & 0 & 0 & 0 & 0 & 0 \\
0 & 0 & 0 & 0 & 0 & 0 & 0 & 0 & 0 & 0 & d_{\uparrow\downarrow\uparrow\downarrow} & 0 & 0 & 0 & 0 & 0 \\
0 & 0 & 0 & 0 & 0 & 0 & 0 & 0 & 0 & 0 & 0 & d_{\uparrow\downarrow\uparrow\uparrow} & 0 & 0 & 0 & 0 \\
0 & 0 & 0 & 0 & 0 & 0 & 0 & 0 & 0 & 0 & 0 & 0 & d_{\uparrow\uparrow\downarrow\downarrow} & 0 & 0 & 0 \\
0 & 0 & 0 & 0 & 0 & 0 & 0 & 0 & 0 & 0 & 0 & 0 & 0 & d_{\uparrow\uparrow\downarrow\uparrow} & 0 & 0 \\
0 & 0 & 0 & 0 & 0 & 0 & 0 & 0 & 0 & 0 & 0 & 0 & 0 & 0 & d_{\uparrow\uparrow\uparrow\downarrow} & 0 \\
0 & 0 & 0 & 0 & 0 & 0 & 0 & 0 & 0 & 0 & 0 & 0 & 0 & 0 & 0 & d_{\uparrow\uparrow\uparrow\uparrow}
\end{bmatrix}$$

If this system is then used for a one-bit computation operation by treatment equivalent to applying a unitary transform $\hat{U}$ to a deviation matrix describing a system comprising the first spin only, the resulting state of the system is either $\hat{U}|\downarrow><\downarrow|\hat{U}$ or $\hat{U}|\uparrow><\uparrow|\hat{U}$, the two states being distinguished by the state of the second spin, which is determined at readout.

This principle can be generalized to produce an initial state in which more than one spin is in a pure state. For the usual initial state of a n-spin system, if the differences in which each of the diagonal entries is the deviation, for its respective quantum state, from a uniform population distribution over the possible quantum states. The upper left corner entry is the deviation parameter for the system state in which each of the spins is in a down state. The deviation matrix representing the 4-spin all-down pure state would have only one nonzero diagonal entry. However, for small differences between resonant frequencies, the usual initial state of such a system at thermal equilibrium is represented by $$\hat{\rho}_\Delta = \frac{-\alpha}{16} \left[\begin{array}{cccc|cccc|cccc|cccc} 2 & 0 & 0 & 0 & 0 & 0 & 0 & 0 & 0 & 0 & 0 & 0 & 0 & 0 & 0 & 0 \\ 0 & 1 & 0 & 0 & 0 & 0 & 0 & 0 & 0 & 0 & 0 & 0 & 0 & 0 & 0 & 0 \\ 0 & 0 & 1 & 0 & 0 & 0 & 0 & 0 & 0 & 0 & 0 & 0 & 0 & 0 & 0 & 0 \\ 0 & 0 & 0 & 0 & 0 & 0 & 0 & 0 & 0 & 0 & 0 & 0 & 0 & 0 & 0 & 0 \\ \hline 0 & 0 & 0 & 0 & 1 & 0 & 0 & 0 & 0 & 0 & 0 & 0 & 0 & 0 & 0 & 0 \\ 0 & 0 & 0 & 0 & 0 & 0 & 0 & 0 & 0 & 0 & 0 & 0 & 0 & 0 & 0 & 0 \\ 0 & 0 & 0 & 0 & 0 & 0 & 0 & 0 & 0 & 0 & 0 & 0 & 0 & 0 & 0 & 0 \\ 0 & 0 & 0 & 0 & 0 & 0 & 0 & -1 & 0 & 0 & 0 & 0 & 0 & 0 & 0 & 0 \\ \hline 0 & 0 & 0 & 0 & 0 & 0 & 0 & 0 & 1 & 0 & 0 & 0 & 0 & 0 & 0 & 0 \\ 0 & 0 & 0 & 0 & 0 & 0 & 0 & 0 & 0 & 0 & 0 & 0 & 0 & 0 & 0 & 0 \\ 0 & 0 & 0 & 0 & 0 & 0 & 0 & 0 & 0 & 0 & 0 & 0 & 0 & 0 & 0 & 0 \\ 0 & 0 & 0 & 0 & 0 & 0 & 0 & 0 & 0 & 0 & 0 & -1 & 0 & 0 & 0 & 0 \\ \hline 0 & 0 & 0 & 0 & 0 & 0 & 0 & 0 & 0 & 0 & 0 & 0 & 0 & 0 & 0 & 0 \\ 0 & 0 & 0 & 0 & 0 & 0 & 0 & 0 & 0 & 0 & 0 & 0 & 0 & -1 & 0 & 0 \\ 0 & 0 & 0 & 0 & 0 & 0 & 0 & 0 & 0 & 0 & 0 & 0 & 0 & 0 & -1 & 0 \\ 0 & 0 & 0 & 0 & 0 & 0 & 0 & 0 & 0 & 0 & 0 & 0 & 0 & 0 & 0 & 2 \end{array}\right],$$

equation 3 which has only six eigenvalues approximating zero. Treating the system according to a process describable by a unitary transform (e.g., by applying one or more RF pulses) cannot convert such an initial state into a desirable 4-spin pure state. But a unitary transform can convert each of the upper two 4×4 blocks to matrices proportional to $$\begin{bmatrix} 1 & 0 & 0 & 0 \\ 0 & 0 & 0 & 0 \\ 0 & 0 & 0 & 0 \\ 0 & 0 & 0 & 0 \end{bmatrix},$$

corresponding to both of the C and D qubits being in the down state. The corresponding treatment of the system thus puts the two qubit spins in a pure state when conditioned on the state of A and B, the ancilla spins. A similar argument could be made regarding the all-up quantum state represented by the lower right portion of the matrix.

Note that the spin states of the qubits alone would not give a pure state; it is necessary to know the spin states of the ancilla spins as well. In this sense the logical qubits are actually coherences of the four-spin system. The deviation matrix resulting from applying the unitary transform is $$\hat{\rho}_\Delta{'} = \frac{-\alpha}{8} \begin{bmatrix} |\downarrow\downarrow\rangle\langle\downarrow\downarrow| & 0 & 0 & 0 \\ 0 & -|\downarrow\downarrow\rangle\langle\downarrow\downarrow| & 0 & 0 \\ 0 & 0 & G_1 & 0 \\ 0 & 0 & 0 & G_2 \end{bmatrix},$$

which contains matrices $G_1$ and $G_2$ which act as an environment to receive the entropy rejected in forming the upper left qubit block representing the pure state. Freezing evolution of the ancilla spins, for example by decoupling, prohibits interaction of the four diagonal block matrices with one another, so that further consideration of the dynamics of the ancilla spins is unnecessary. A k-qubit pure state may be prepared from a N-spin system, where N=2k, in this manner.

Furthermore, it is also possible to prepare an effectively pure state whose qubit block does not have $2^k - 1$ diagonal elements equal to zero by creating an excess or deficient population of a single quantum state against a set of uniformly populated levels as a background. Consider for example a 2-spin system represented by the following deviation matrix at thermal equilibrium:

$$\hat{\rho}_\Delta = \alpha \begin{bmatrix} -3 & 0 & 0 & 0 \\ 0 & 1 & 0 & 0 \\ 0 & 0 & 1 & 0 \\ 0 & 0 & 0 & 1 \end{bmatrix}.$$

The only net transverse magnetization that would be observable after applying a 90° single-spin rotation to the ensemble would be due to the spins in the $|\downarrow\downarrow\rangle$ state because contributions by the balanced uniform populations of the states would cancel one another. Although the quantum state of the system is clearly a statistical mixture of the four possible states, the excess relative population of $4\alpha N$ spins in the same pure quantum state ($|\downarrow\downarrow\rangle$) provides a 2-qubit pure state.

In the case of the naturally existing initial state of the 4-spin system represented by equation 3, treatment describable as a unitary transform on the spin states can be used to selectively exchange populations among the quantum states with the result that the diagonal elements are permuted to a convenient block matrix structure $$\text{diag}(\hat{\rho}_\Delta) \doteq [[2\ 0\ 0\ 0][-1\ 1\ 1\ 1][1\ -1\ -1\ -1][-2\ 0\ 0\ 0]], \quad \text{equation 4}$$

in which $\doteq$ indicates equality up to a sign and a constant offset factor in each block. This state represents four independent pairs of 2-qubit pure states when conditioned on the two ancilla spins, for which the deviation matrix may be written:

$$\hat{\rho}_\Delta{'} \doteq \frac{\alpha}{16} \begin{bmatrix} |\downarrow\downarrow\rangle\langle\downarrow\downarrow| & 0 & 0 & 0 \\ 0 & |\downarrow\downarrow\rangle\langle\downarrow\downarrow| & 0 & 0 \\ 0 & 0 & |\downarrow\downarrow\rangle\langle\downarrow\downarrow| & 0 \\ 0 & 0 & 0 & |\downarrow\downarrow\rangle\langle\downarrow\downarrow| \end{bmatrix}.$$

This state relabeling can be implemented using a series of c-NOT operations. (The c-NOT operation is described in the following section.) In particular, the sequence $C_{AC}C_{BC}C_{CB}C_{CA}$ converts the deviation matrix of equation 3 to the one indicated by equation 4.

The assumption that the chemical shifts are small has been operative throughout the discussion of the pure state preparation. Any error in this assumption adds an additional term to the initial density matrix:

$$\hat{\rho} = \frac{\hat{1}}{2^n} + \hat{\rho}_\Delta + \varepsilon \hat{\rho}_{error}.$$

The error results in an additional term $\varepsilon \hat{U} \hat{\rho}_{error} \hat{U}^\dagger$ to the result of the unitary transform shown in equation 2. The magnitude of the initial error is unchanged, and thus, for small $\varepsilon$, standard statistical techniques can be used to extract the computational result efficiently.

The preferred approach of the invention to initial state preparation is to identify equally populated states, naturally existing in a thermal ensemble, having the same (zero or nonzero) deviations. The ensemble is treated according to a unitary transform which groups together these states to form a uniform background against which a differently populated state can be expressed as an effective pure state. Ancilla spins label this group, so that an initial state is prepared in which some of the spins, the k qubits, are in a jointly pure state when conditioned on the states of the n-k ancilla spins.

In permuting the elements of the deviation matrix by a unitary transform to create a k-qubit pure state, the following condition must be fulfilled:

$$k \leq \log\left[\frac{n!}{\left(\left[\frac{n}{2}\right]!\right)^2} + 1\right] \approx n - O(\log_2 n).$$

Therefore, for large n it is possible to fit at least one computer of $k \approx n$ qubits in an n-spin molecule, composed (for example) from the all-down configuration precessing in a uniformly populated manifold of states originally having equal numbers of spins in up and down spin states.

As a practical matter, tension exists between this potential large computation space and the signal strength. Off all of the possible states of the $O(\log_2 n)$ ancilla spins, only one-or at best a few-will indicate a valid computation. Fundamentally, this is because this approach to pure state preparation does not change the overall temperature of the system; only a very small conditional subset of the spins are "cold". The strength of the observable signal scales as $$mV\frac{n\alpha}{2^n},$$

in which m is the density of entities, V is the sample volume, and $$\frac{n\alpha}{2^n}$$

is the probability of finding a particular n-spin configuration. Thus, a quantum computation using k=10 qubits explores a state space of size $2^{10}$, larger than that realized using any prior-art concept.

However, for a typical $\alpha$ at room temperature, performing a 10-qubit calculation using an ensemble of n=15-spin entities may scale the signal strength by a factor of 0.01 compared to using the same ensemble for a single-qubit calculation. Still, it is possible to see such a signal using modern phase cycling and subtraction techniques. Better entropy packing techniques that take advantage of more of the initial thermal state can be used to exploit more than 10 qubits, but these probably only give additional polynomial factors of n. Initial spin cooling may be used (such as by coherence transfer, optical pumping, or conventional refrigeration) which can increase the signal strength exponentially.

An alternative approach to preparing a pure state is treatment of the system by a process describable by a nonunitary transform. Such a process can be implemented, for example, using nonuniform magnetic fields or through interactions with other degrees of freedom that relax quickly.

Yet another approach to effectively scaling up the computation space is to process and readout individual localities in the ensemble independently, for example by a movable probe, thereby carrying out several operations in parallel. Thus, each individual locality serves as a homogeneous subsystem, all of the subsystems being coupled inhomogeneously to one another, so that the volume over which modifications from thermal equilibrium must be maintained is reduced. Designing quantum algorithms that produce answers one bit at a time, trading off a logarithmic increase in the number of times a calculation needs to be run for less-stringent initial pure state size requirements is another possibility.

Computation Operations

Quantum computation may be performed using a bulk thermal ensemble, prepared in an appropriate initial state, by treating the ensemble so as to affect the spin states and coherences in a manner describable by multiplying the density matrix by a unitary operator. The types of unitary operators required for quantum computation correspond to an arbitrary single-spin rotation which performs a single-bit operation and a coupled multi-spin rotation which implements a logic function. As already described hereinabove, standard NMR pulse techniques including refocusing and decoupling are available to generate an arbitrary single-spin rotation.

The invention provides a pulse sequence that implements a nonlinear multi-spin function known as the controlled-NOT or c-NOT operation, which conditionally flips the state of one spin based on the value of another spin. The interaction terms in the Hamiltonian provide the required non-linearity. For a two-spin system with dipolar coupling, a c-NOT can be implemented as a controlled phase shift, specified by a unitary matrix with diagonal elements {1,1, 1,-1}, preceded and followed by rotations, given by the sequence $C_{AB} = R_{yA}(-90) \, R_{zB}(-90) \, R_{zA}(-90) \, R_{zAB}(90) \, R_{yA}(90)$. The product of the corresponding rotation matrices give $$C_{AB} = \frac{1}{2^{\frac{5}{2}}} \begin{bmatrix} 1 & -1 & 0 & 0 \\ 1 & 1 & 0 & 0 \\ 0 & 0 & 1 & -1 \\ 0 & 0 & 1 & 1 \end{bmatrix} \begin{bmatrix} 1-i & 0 & 0 & 0 \\ 0 & 1-i & 0 & 0 \\ 0 & 0 & 1+i & 0 \\ 0 & 0 & 0 & 1+i \end{bmatrix} \begin{bmatrix} 1-i & 0 & 0 & 0 \\ 0 & 1+i & 0 & 0 \\ 0 & 0 & 1-i & 0 \\ 0 & 0 & 0 & 1+i \end{bmatrix} \times \quad \text{equation 5}$$

$$\begin{bmatrix} 1+i & 0 & 0 & 0 \\ 0 & 1-i & 0 & 0 \\ 0 & 0 & 1-i & 0 \\ 0 & 0 & 0 & 1+i \end{bmatrix} \begin{bmatrix} 1 & 1 & 0 & 0 \\ -1 & 1 & 0 & 0 \\ 0 & 0 & 1 & 1 \\ 0 & 0 & -1 & 1 \end{bmatrix} = \sqrt{i} \begin{bmatrix} 1 & 0 & 0 & 0 \\ 0 & 1 & 0 & 0 \\ 0 & 0 & 0 & 1 \\ 0 & 0 & 1 & 0 \end{bmatrix},$$

which is the c-NOT operation up to an irrelevant overall phase which could be removed by extra rotations.

If the A spin in the A-B system is in the up state, so that the state of the system is $|\uparrow\uparrow\rangle$ or $|\uparrow\downarrow\rangle$, the effect of applying the pulse sequence implementing the c-NOT to the system in this state is to change the spin state of the B spin, thereby flipping the value of the second qubit. If the system is in $|\downarrow\uparrow\rangle$ or $|\downarrow\downarrow\rangle$, the c-NOT leaves the state of the system unchanged.

For example, the deviation matrix corresponding to $|\uparrow\uparrow\rangle$ is $$\hat{\rho}_\Delta = \begin{bmatrix} 0 & 0 & 0 & 0 \\ 0 & 0 & 0 & 0 \\ 0 & 0 & 0 & 0 \\ 0 & 0 & 0 & 1 \end{bmatrix}.$$

. The c-NOT pulse sequence changes the state of the system to $|\uparrow\downarrow\rangle$ as indicated by the product $$C_{AB}\hat{\rho}_\Delta C_{AB}' = \begin{bmatrix} 0 & 0 & 0 & 0 \\ 0 & 0 & 0 & 0 \\ 0 & 0 & 1 & 0 \\ 0 & 0 & 0 & 0 \end{bmatrix}.$$

The feasibility of this c-NOT sequence has been demonstrated by the similar routinely used NMR sequence INEPT (Insensitive Nuclei Enhancement by Polarization Transfer). (See, e.g., Morris et al., *J. American Chemical Society*, 101:760 [1979].) The INEPT sequence, $R_{yA}(90) \ R_{zAB}(90) \ R_{xA}(90)$, is used to shift population from a less-sensitive spin state to a more-sensitive spin state. The corresponding unitary operator has the same form as the c-NOT matrix shown in equation 5 except for phase differences among the nonzero elements.

It should be stressed that the foregoing prescription is not confined to c-NOT logic operations. It is well understood that the ability to execute a two-spin nonlinear operator such as c-NOT, in conjunction with the further ability to perform arbitrary single-spin rotations as demonstrated herein, is sufficient to facilitate straightforward performance any logic operation. Accordingly, the present invention provides a complete prescription for quantum computing not limited to particular operations.

Molecular structure determinations by NMR can entail sequences of hundreds of pulses, probing coupling in networks of hundreds of spins. To construct a NMR-based computation system with many qubits, it is possible to use only the two-spin interaction terms; the process of refocusing or decoupling selectively activates or suppresses Hamiltonian terms based on the parity of the number of times the angular momentum operator of the affected spin appears in each term. Such a parity matrix is a complete basis for representing the system.

It may also be practical to use higher-order terms to reduce the number of steps necessary to perform a given computation. For example, six-quanta transitions have been observed in benzene.

Readout

A general quantum computation can produce as output a state, which is indicated by the diagonal terms in the final deviation density matrix $\hat{\rho}_\Delta$.

In one embodiment, logical state readout of the computation result is accomplished using measurement of the transverse magnetization of the ensemble as is done in conventional NMR techniques. Each spin i contributes a component $M_i$ to the total transverse magnetization M proportional to the trace of the product of the deviation matrix and the angular momentum operators $$M_i = N(\langle \mu_x \rangle + i \langle \mu_y \rangle) = N\gamma \hbar Tr(\hat{\rho}_\Delta(\hat{I}_{xi} + i\hat{I}_{yi})).$$

For a two-spin system, $\hat{\rho}_\Delta$ has 16 degrees of freedom, or equivalently, the state of the system is described by 16 product operator expansion coefficients. Due to orthogonality of the product operators, the detected magnetization M is given by the coefficients of the [x1] and [1x] product operators, and with a 90° phase shift, by the coefficients of the [y1] and [1y] operators, giving 4 of the 16 terms. By well-known means, pulse sequences can exchange populations to render any desired product-operator term observable. Thus, it is possible to measure the entire deviation matrix by application observation of the bulk ensemble magnetization.

In general, however, it is not necessary to discern every deviation entry because the quantum computation algorithm can be tailored to produce the quantity of interest in one of the immediately observable states. A single set of rotations is sufficient to make any single term—including its time evolution, if desired—in the deviation matrix experimentally observable.

Apparatus

Figure 1:
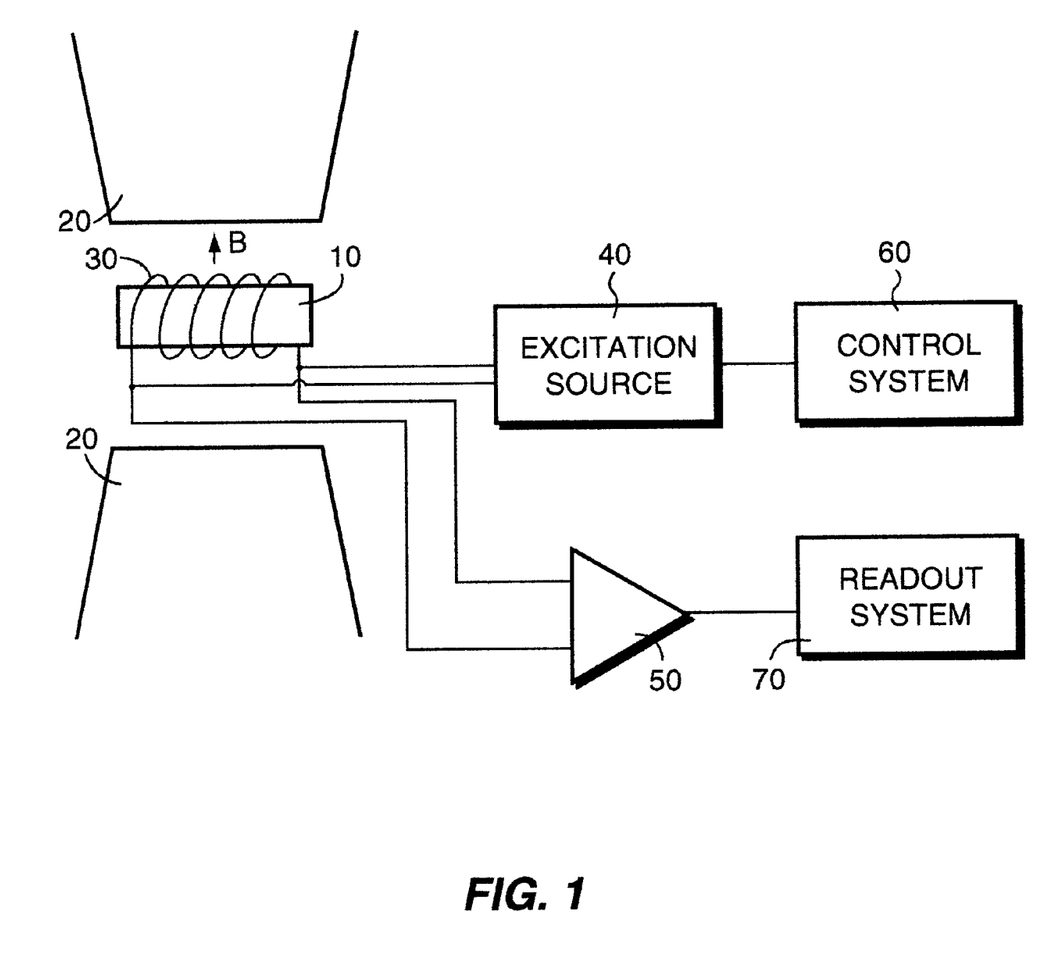
FIG. 1 schematically depicts an apparatus for quantum computation according to the invention.

With reference to FIG. 1, an illustrative embodiment of an apparatus for quantum computing based on nuclear magnetic resonance according to the invention includes a bulk thermal ensemble positioned in a static magnetic field B imposed by a field-producing system 20. In the case of a liquid or gaseous ensemble, the ensemble is held within a container or other supporting means indicated at 10; in the case of a solid ensemble, the reference numeral 10 indicates the ensemble itself, borne on a platform or other support. A coil 30 encircling the ensemble 10 is coupled to a source of electromagnetic excitation 40 and an output amplifier 50. A control system 60 is coupled to the source 40 so as to control the delivery of signal by the source 40 to the coil 30. A readout system 70 is coupled to the amplifier 50 so as to receive its output for further processing.

Figure 2:
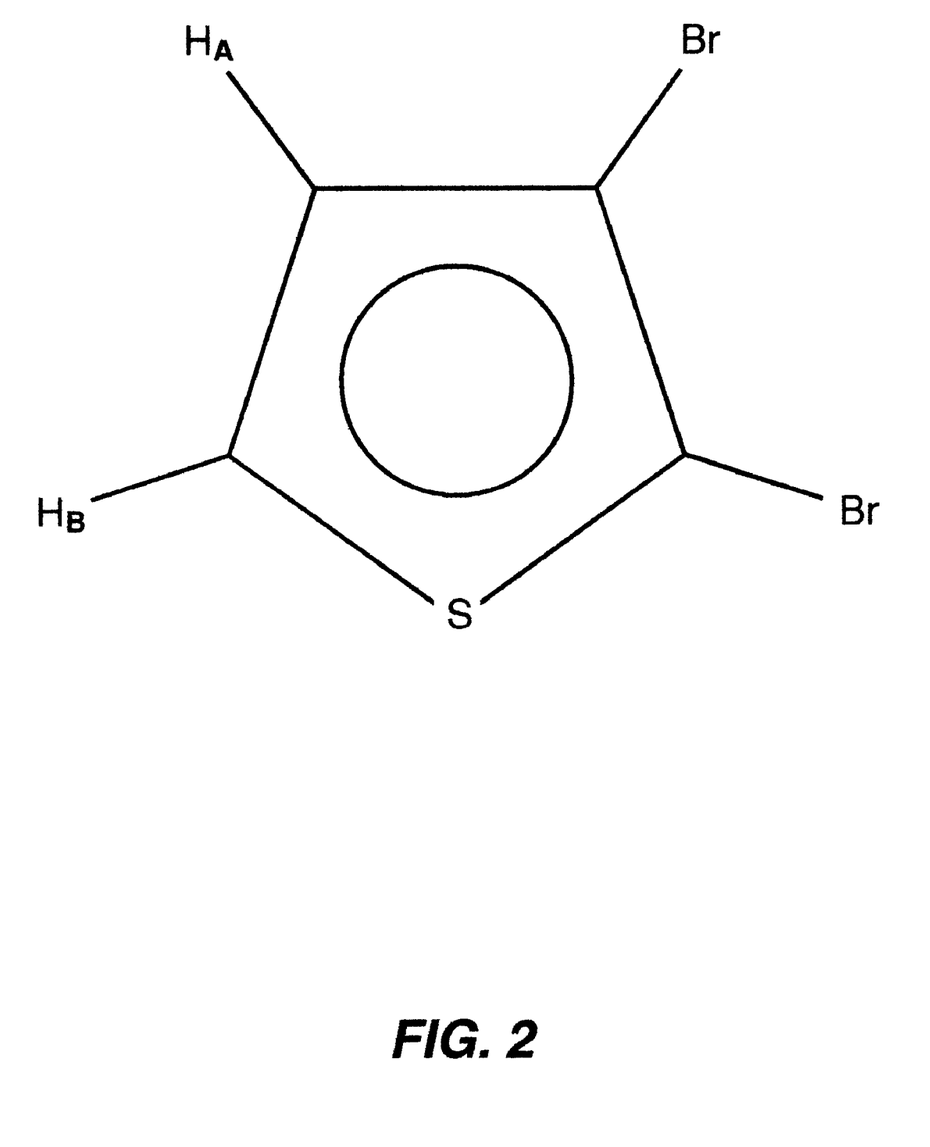
FIG. 2 shows the chemical structure of 2,3-dibromothiophene, a material useful for the bulk ensemble of a two-spin embodiment of the present invention.

The bulk thermal ensemble 10 is an aggregate of a very large number of identical multi-spin entities, such as several grams of a molecular liquid having several distinguishable nuclei. For a two-spin, two-qubit system, a useful compound (namely, 2,3-dibromothiophene) is shown in FIG. 2; the two asymmetric hydrogen atoms A, B furnish the ancilla spins used to prepare a pure state. Compounds such as 2,3-dibromopropionic acid or a symmetrically trisubstituted benzene with different substituents provide three-spin systems. Other materials appropriate for ensemble 10 include benzene derivatives or other ring structures with at least one heterologous member, or coumarin.

Any one of several structures may serve as the field-producing system 20. The simplest and least expensive approach includes compact permanent magnets or uses the earth's magnetic field. Electromagnets or superconducting magnets are also suitable and may also be coupled to the computer 60 to allow regulation or variation of the static field strength.

The coil 30 is configured to impose a time-varying magnetic field on the ensemble 10 when energized by the source 40. The source 40 is configured to generate radiation of a given amplitude and frequency, typically a series of RF pulses, as directed by the control system 60. This configuration of the coil 30 is also appropriate for sensing the bulk transverse magnetization of the ensemble 10.

Preferably, the functions of the control system 60 and the readout system 70 reside in a single device, for example a conventional computer. Such a computer would facilitate coordination of the pulsing and sensing operations of the coil 30.

In operation, the control system 60 operates the source 40 to deliver a sequence of one or more electromagnetic pulses that modify the ensemble so that it is no longer in thermal equilibrium, in a manner equivalent to the outcome of applying a unitary operation to the deviation matrix representing the quantum state of the ensemble, as described hereinabove. The control system 60 is programmed to determine the pulse sequence, i.e., the frequencies of the pulses and their separation in time, that is equivalent to a desired operation or sequence of operations defining the computations of interest. The characteristics of these sequences are determined by the control system 60 based on the strength of the static magnetic field and physical data for the ensemble, such as magnetic resonance spectrum and related properties of the nuclei. In other words, control system 60 first determines the qubit operations necessary to accomplish a given quantum operation in accordance with quantum computational theory, and proceeds to implement these operations on ensemble 10 using source 40. Thus, in representing qubits in terms of the quantum states of the ensemble corresponding thereto, the control system 60 serves as the bridge between deviation values and the information to be processed.

Generally, application of a pulse sequence is necessary to prepare the ensemble for the quantum computation operations. After control system 60 puts the ensemble 10 into an appropriate initial state, it applies the pulse sequence necessary to execute the quantum computation operations. The readout system 70 receives the bulk magnetization data from the amplifier 50 and uses the static field strength and materials information for the ensemble to derive from the data the ensemble quantum state information containing the result of the computation, as discussed hereinabove.

It will therefore be seen that the foregoing represents a highly extensible and advantageous approach to quantum computation. The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed. For example, the various modules of the invention can be implemented on a general-purpose computer using appropriate software instructions, or as hardware circuits, or as mixed hardware-software combinations.

We claim:

1. A method of processing quantum information comprising the steps of:
   a. providing an ensemble of a plurality of entities, the ensemble being characterized by a plurality of quantum states each characterized by a uniform population probability and a deviation therefrom;
   b. representing the information by the deviations; and
   c. processing the represented information by detectably modifying the deviations in a pattern corresponding to an information-processing operation.

2. The method of claim 1 wherein the information-processing operation is a computation.

3. The method of claim 1 wherein the computation is a logic function.

4. The method of claim 3 wherein the logic function is c-NOT.

5. The method of claim 1 wherein the processing step comprises detectably setting a deviation of a first quantum state based on a deviation of a second quantum state nonlinearly coupled thereto so as to effect the information-processing operation.

6. The method of claim 1 further comprising the step of obtaining the processed information by detecting the pattern of the deviations after the processing step.

7. The method of claim 1 wherein the ensemble is a bulk thermal ensemble of the plurality of entities.

8. The method of claim 6 wherein the step of obtaining the processed information comprises observing a magnetization of the ensemble.

9. The method of claim 7 wherein the processing step comprises detectably setting a spin state of a first subset of the plurality of spins based on a spin state of a second subset of the plurality of spins in accordance with a computation, the first and second subsets of spins being nonlinearly coupled so as to effect the computation.

10. The method of claim 1 wherein the step of modifying the deviation comprises applying electromagnetic radiation to the ensemble.

11. The method of claim 10 wherein each of the quantum states has an energy level, any pair of the energy levels being separated by an increment corresponding to a respective resonant frequency, the electromagnetic radiation comprising a sequence of pulses, at least one of the pulses having a frequency approximating one of the resonant frequencies.

12. The method of claim 11 wherein at least one of the pulses performs a single-spin rotation.

13. The method of claim 12 wherein the sequence of pulses includes a set of refocusing pulses.

14. The method of claim 11 wherein at least one of the pulses performs a coupled multi-spin rotation.

15. The method of claim 11 wherein each of the entities has an A spin and a B spin and the ensemble is in a dc magnetic field oriented along a z-axis, the computation comprising a controlled-NOT operation.

16. The method of claim 15 wherein the sequence of pulses comprises $C_{AB}R_{yA}(-90)R_{zB}(-90)R_{zA}(-90)R_{zAB}(90)R_{yA}(90)$.

17. The method of claim 1 wherein the ensemble is characterized by a density matrix having entries corresponding to population probabilities, the density matrix being the sum of identity and deviation matrices, the identity matrix having entries corresponding to the uniform population probabilities of the respective quantum states, and the deviation matrix having entries corresponding to deviations of the population probabilities of the respective quantum states from uniformity.

18. The method of claim 17 wherein applying electromagnetic radiation to the ensemble effect s at least one unitary transform of the deviation matrix.

19. The method of claim 11 wherein the sequence of pulses performs at least on e arbitrary single-spin rotation and at least one coupled multi-spin rotation.

20. The method of claim 1 further comprising the step of preparing an initial state of the ensemble by causing the deviations characterizing at least some of the quantum states to assume known values.

21. The method of claim 20 wherein the step of preparing the initial state comprises rejecting entropy from an equilibrium state to create a pure state.

22. The method of claim 20 wherein:
  a. the entities each have a plurality of spins each in a spin state, the quantum states each being specified by a plurality of spin states; and
  b. in the initial state at least one of the plurality of spins is in a pure state when conditioned on the state of at least one ancilla spin.

23. The method of claim 17 further comprising the step of preparing an initial state of the ensemble by applying electromagnetic radiation so as to effect at least one unitary transform of the deviation matrix, thereby causing at least some of the deviation matrix entries to assume known values.

24. The method of claim 13 wherein at least one of the pulses performs decoupling.

25. The method of claim 24 herein the entities each have a plurality of spins each in a spin state, the quantum states each being specified by a plurality of spin states.

26. The method of claim 6 wherein the step of obtaining the processed information comprises applying electromagnetic radiation to the ensemble.

27. The method of claim 17 wherein the pattern is represented by at least one deviation-matrix entry.

28. The method of claim 27 wherein the deviation matrix includes observable and nonobservable components and further comprising the step of detecting the pattern of the deviations by applying electromagnetic radiation to the ensemble so as to interchange entries in the deviation matrix, thereby placing the at least one deviation-matrix entry corresponding to the pattern in an observable component.

29. The method of claim 28 wherein the step of obtaining the processed information further comprises observing a magnetization of the ensemble.

30. The method of claim 25 wherein the spins are nuclear spins.

31. The method of claim 25 wherein the electromagnetic radiation is a sequence of nuclear magnetic resonant pulses.

32. Information-processing apparatus comprising:
  a. means for supporting a bulk ensemble of a plurality of entities, the ensemble being characterized by a plurality of quantum states each characterized by a uniform population probability and a deviation therefrom;
  b. means for representing the information by the deviations; and
  c. means for processing the represented information by detectably modifying the deviation in a pattern corresponding to an information-processing operation.

33. The apparatus of claim 32 further comprising means for obtaining the processed information by detecting the pattern of the deviations after processing by the processing means.

34. The apparatus of claim 33 wherein the information-processing operation is a computation.

35. The apparatus of claim 34 wherein the computation is a logic function.

36. The apparatus of claim 35 wherein the logic function is c-NOT.

37. The apparatus of claim 32 further comprising a bulk thermal ensemble of the plurality of entities.

38. The apparatus of claim 37 wherein the entities each have a plurality of spins each in a spin state, the quantum states each being specified by a plurality of spin states.

39. The apparatus of claim 38 wherein the processing means is configured to detectably set the spin state of a first subset of the plurality of spins based on the spin state of a second subset of the plurality of spins in accordance with a computation, the first and second spin subsets being non-linearly coupled so as to effect the computation.

40. The apparatus of claim 37 wherein the processing means is configured to modify the deviations by applying electromagnetic radiation to the ensemble.

41. The apparatus of claim 40 wherein each of the quantum states has an energy level, any pair of the energy levels being separated by an increment corresponding to a respective resonant frequency, the processing means being configured to apply the electromagnetic radiation in a sequence of pulses, at least one of the pulses having a frequency approximating one of the resonant frequencies.

42. The apparatus of claim 41 wherein at least one of the pulses performs a single-spin rotation.

43. The method of claim 42 wherein the sequence of pulses includes a set of refocusing pulses.

44. The apparatus of claim 41 wherein at least one of the pulses performs a coupled multi-spin rotation.

45. The apparatus of claim 41 wherein each of the entities has an A spin and a B spin and the ensemble is in a dc magnetic field oriented along a z-axis, the computation comprising a controlled-NOT operation.

46. The apparatus of claim 45 wherein the sequence of pulses comprises $C_{AB}=R_{yA}(-90)\ R_{zB}(-90)\ R_{zA}(-90)\ R_{zAB}(90)\ R_{yA}(90)$.

47. The apparatus of claim 37 wherein the ensemble is characterized by a density matrix having entries corresponding to population probabilities, the density matrix being the sum of identity and deviation matrices, the identity matrix having entries corresponding to the uniform population probabilities of the respective quantum states, and the deviation matrix having entries corresponding to deviations of the population probabilities of the respective quantum states from uniformity.

48. The apparatus of claim 47 wherein applying electromagnetic radiation to the ensemble effects at least one unitary transform of the deviation matrix.

49. The apparatus of claim 41 wherein the sequence of pulses performs at least one arbitrary single-spin rotation and at least one coupled multi-spin rotation.

50. The apparatus of claim 32 wherein the processing means is configured to prepare an initial state of the ensemble by causing the deviations characterizing at least some of the quantum states to assume known values.

51. The apparatus of claim 50 wherein the initial state is prepared by rejecting entropy from an equilibrium state to create a pure state.

52. The apparatus of claim 50 wherein the processing means prepare the initial state by applying electromagnetic radiation so as to effect at least one unitary transform of the deviation matrix, thereby causing at least some of the deviation matrix entries to assume known values.

53. The apparatus of claim 33 wherein the means for obtaining the processed information detects a magnetization of the ensemble.

54. The apparatus of claim 53 wherein the magnetization is a bulk magnetization.

55. The apparatus of claim 54 wherein the means for obtaining the processed information applies electromagnetic radiation to the ensemble.

56. The apparatus of claim 52 wherein the pattern is represented by at least one deviation-matrix entry.

57. The apparatus of claim 56 wherein the deviation matrix includes observable and nonobservable components, the means for obtaining the processed information being configured to detect the pattern of the deviations by applying electromagnetic radiation to the ensemble so as to interchange entries in the deviation matrix, thereby placing the at least one deviation-matrix entry corresponding to the pattern in an observable component.

58. The apparatus of claim 38 wherein the spins are nuclear spins.

59. The apparatus of claim 40 wherein the electromagnetic radiation is a sequence of nuclear magnetic resonant pulses.

60. The apparatus of claim 38 further comprising means for applying a static magnetic field to the ensemble.

61. The method of claim 14 wherein at least one of the pulses performs refocusing.

62. The method of claim 61 wherein at least one of the pulses performs decoupling.

63. The method of claim 19 wherein at least one of the pulses performs refocusing.

64. The method of claim 63 wherein at least one of the pulses performs decoupling.

65. The method of claim 8 wherein the magnetization is a bulk magnetization.

66. The method of claim 29 wherein the magnetization is a bulk magnetization.

67. The apparatus of claim 43 wherein at least one of the pulses performs decoupling.

68. The apparatus of claim 44 wherein at least one of the pulses performs refocusing.

69. The apparatus of claim 68 wherein at least one of the pulses performs decoupling.

70. The apparatus of claim 49 wherein at least one of the pulses performs refocusing.

71. The apparatus of claim 70 wherein at least one of the pulses performs decoupling.

* * * * *